US007486702B1

(12) United States Patent
Yang

(10) Patent No.: US 7,486,702 B1
(45) Date of Patent: Feb. 3, 2009

(54) DDR INTERFACE FOR REDUCING SSO/SSI NOISE

(75) Inventor: Zhiping Yang, Santa Clara, CA (US)

(73) Assignee: Cisco Technology, Inc, San Jose, CA (US)

( * ) Notice: Subject to any disclaimer, the term of this patent is extended or adjusted under 35 U.S.C. 154(b) by 888 days.

(21) Appl. No.: 10/638,624

(22) Filed: Aug. 11, 2003

(51) Int. Cl.
*H04J 3/06* (2006.01)
(52) U.S. Cl. .................. 370/518; 375/375; 713/500
(58) Field of Classification Search ......... 370/517–519, 370/537–539; 375/146, 254, 259, 295, 260, 375/354, 355, 356, 364, 371, 372, 374, 375, 375/376, 377; 327/16; 713/400, 500–503, 713/600
See application file for complete search history.

(56) References Cited

U.S. PATENT DOCUMENTS

| | | | | |
|---|---|---|---|---|
| 5,917,331 A * | 6/1999 | Persons | ...................... | 324/765 |
| 6,307,905 B1 * | 10/2001 | Agazzi | ...................... | 375/371 |
| 6,687,322 B1 * | 2/2004 | Zhang et al. | ................. | 375/376 |
| 6,801,989 B2 * | 10/2004 | Johnson et al. | ............. | 711/167 |
| 6,894,531 B1 * | 5/2005 | Nouban et al. | ................. | 326/38 |
| 6,934,866 B2 * | 8/2005 | Lin et al. | ...................... | 713/401 |
| 6,941,484 B2 * | 9/2005 | To et al. | ...................... | 713/500 |
| 7,036,055 B2 * | 4/2006 | Muljono et al. | ............. | 714/716 |
| 2002/0172314 A1 * | 11/2002 | Lin et al. | ...................... | 375/376 |
| 2003/0133527 A1 * | 7/2003 | Joo et al. | ...................... | 375/354 |
| 2003/0204763 A1 * | 10/2003 | Moss et al. | ................. | 713/400 |
| 2003/0217303 A1 * | 11/2003 | Chua-Eoan et al. | ......... | 713/600 |

OTHER PUBLICATIONS

Optical Internetworking Forum, "System Packet Interface Level 4 (SPI-4) Phase 2: OC-192 System Interface for Physical and Link Layer Devices", Implementation Agreement OIF-SPI4-02.0, Jan. 2001, 64 pages, The Optical Internetworking Forum, 39355 California Street, Suite 307, Fremont, CA 94538: <URL:http://www.oiforum.com/public/documents/OIF-SPI4-02.0.pdf>.

* cited by examiner

*Primary Examiner*—Aung S Moe
*Assistant Examiner*—Habte Mered
(74) *Attorney, Agent, or Firm*—Charles E. Krueger

(57) ABSTRACT

An improved DDR interface uses single-ended technology and phase-shifts all output data signals and the output source clock signal so that each output signal switches at a different time so that IDDQ spikes caused by I/O switching do not accumulate. A dynamic phase adjustment circuit on the receiver compensates for the phase differences. Clock jitter and skew is reduced and the number of IDDQ pins is reduced to provide a more effective design and high density package.

9 Claims, 5 Drawing Sheets

DDR transmitter and receiver

Fig. 1 Prior Art DDR transmitter and receiver

DDR transmitter and receiver

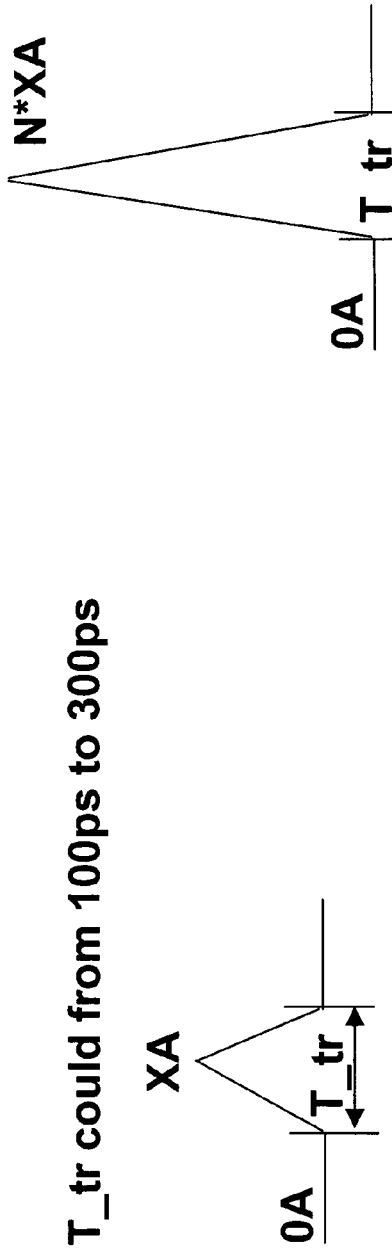
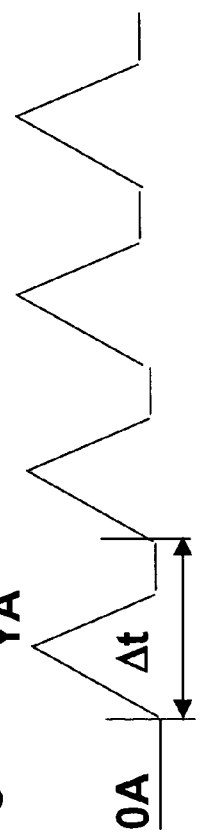
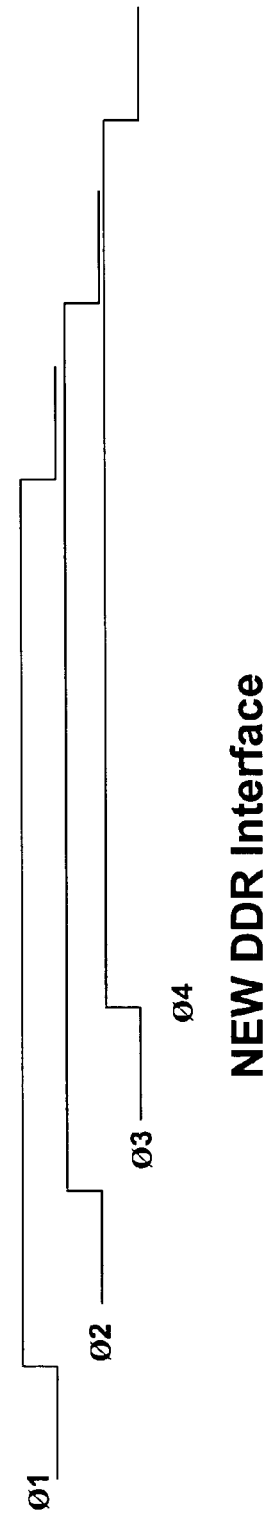
Fig. 5A
Fig. 5B
Fig. 6

DDR INTERFACE FOR REDUCING SSO/SSI NOISE

BACKGROUND OF THE INVENTION

The Double Data Rate (DDR) interface is a very popular source synchronous interface which is widely used in the integrated circuit (IC) industry and in networking products. For a DDR interface, the limiting factor of its operating frequency is clock jitter, clock duty cycle distortion and the skews within the data bus. A standard single-ended DDR interface is depicted in FIG. 1.

The skew is the variation of the transition point for all signals which are referenced to the same clock signal. The variation can be caused by difference loadings, crosstalk from neighbor signals, ISI (Inter-Symbol Interference), SSO/SSI (Simultaneous Switching Output/Input) noise, difference in propagation path lengths, and/or difference in the rise and fall time of the signal. Clock jitter is a variation in the frequency (or phase) of a clock signal due to instability of the clock source, noises coupled from power supply, and/or crosstalk from other signals. Because the DDR latches the data at both rising and falling edges, the duty cycle distortion could have a directly impact on DDR operation.

Based on industry publications and SI analysis by the assignee of the present application, simultaneous switching noise (SSN) due to simultaneous switching of input signals (SSI) and output signals (SSO) has a significant contribution to the clock jitter and data switching uncertainty. The SSI and SSO cause a spike in the quiescent drain current (IDDQ) which in turn causes a spike in the quiescent drain voltage noise (VDDQ_noise). The larger the IDDQ spike the greater the VDDQ_noise, and the larger impact on signal switching uncertainty.

In current designs, it is very common to see that the timing uncertainty due to SSO and SSI noise could be +/−250 ps to +/−350 ps separately on a 250 Mhz and a 125 Mhz DDR interface. Combining the timing uncertainty for SSO and SSI together could result in a total timing uncertainty of +/−500 ps to +/−700 ps from SSN and which is the largest portion of DDR timing budget.

The VDDQ_noise can be reduced by lowering the resistance and inductance of the IDDQ path. Thus, one way to reduce the SSO/SSI noise is to increase the number of power and ground pins supplying VDDQ current to the I/O buffers, thus reducing the signal pins to power/ground pins ratio. However, due to package size limitation and cost consideration, this is no longer an effective solution for large sized ASICs.

The System Packet Interface Level 4, Phase 2 (SPI4.2) Specification utilizes differential signaling and a dynamic clock alignment circuit (DAC) at the receiver. This interface is depicted in FIG. 2. The differential signaling could significantly reduce the SSO/SSI noise, and the DAC circuit could compensate some part of fixed data skews within the signal lines, so SPI4.2 can be operated at higher frequency. The main drawback for SPI4.2 is its differential signaling which doubles the total number of pins compared with single-ended signaling.

FIG. 2 depicts a transmitter side 2 that utilizes a 2× clock to clock data on the rising edge of the clock, so it can avoid duty cycle distortion requirement on 1× clock which is not shown in this patent. On the receiver 4 side a DAC 6 generates phase-shifted clock signals utilized to sample the data. The clock signal phases are optimized so that data is latched in the center of the data window. The DAC also compensates the fixed skew between received data signals, which could be caused by different trace length and process variation cross the interface.

Accordingly, techniques for reducing SSN without increasing total number of pins on an IC are greatly needed in the field.

BRIEF SUMMARY OF THE INVENTION

One embodiment of the invention is a new enhanced DDR interface which can significantly reduce the SSO and SSI noise in a DDR interface. Since the SSO/SSI noise has a significant impact on DDR interface clock jitter and data switching uncertainty, the enhanced DDR interface increasees the DDR bandwidth and reduce the required number of VDDQ power and ground pins, thus leading to a more effective design and high density package.

According to a another embodiment of the invention, a DDR interface utilizes single-ended technology to reduce pin count and reduces the magnitude of IDDQ spikes approximately by a factor of N where N is the number clock phases at the DDR transmitter.

According to a another embodiment of the invention, a DDR interface utilizes phase-shifted clock signals to switch single-ended phase-shifted output data signals and a single-ended phase-shifted source clock signal on the transmit side. The magnitudes of the phase shifts between each signal switched could be greater than the settling time of IDDQ spikes caused by switching so that the amplitudes of the spikes don't add to generate a large spike. If the magnitudes of the phase shifts between each signal switched is less than the settling time of IDDQ spikes caused by switching, the amplitudes of the spikes are still much lower than the case which all signal switch at the same time.

According to a another embodiment of the invention, a dynamic clock alignment (DCA) circuit on the receive side of the interface receives a single-ended or differential transmitted source clock signal and generates compensated clock signals which are aligned to sample data from single-ended phase-shifted data signals. Because of the DCA circuit, it is not necessary to have the serpentine clock traces on the PCB board, so the board space can be saved.

Other features and advantages of the invention will be apparent in view of the following detailed description and appended claims.

BRIEF DESCRIPTION OF THE DRAWINGS

FIGS. 5A and B are graphs depicting a comparison between the switching voltages of a standard DDR interface and an embodiment of the invention; and FIG. 6 is a timing diagram depicting the IDDQ generated by the embodiment of FIG. 3.

DETAILED DESCRIPTION OF THE INVENTION

Figure 3:
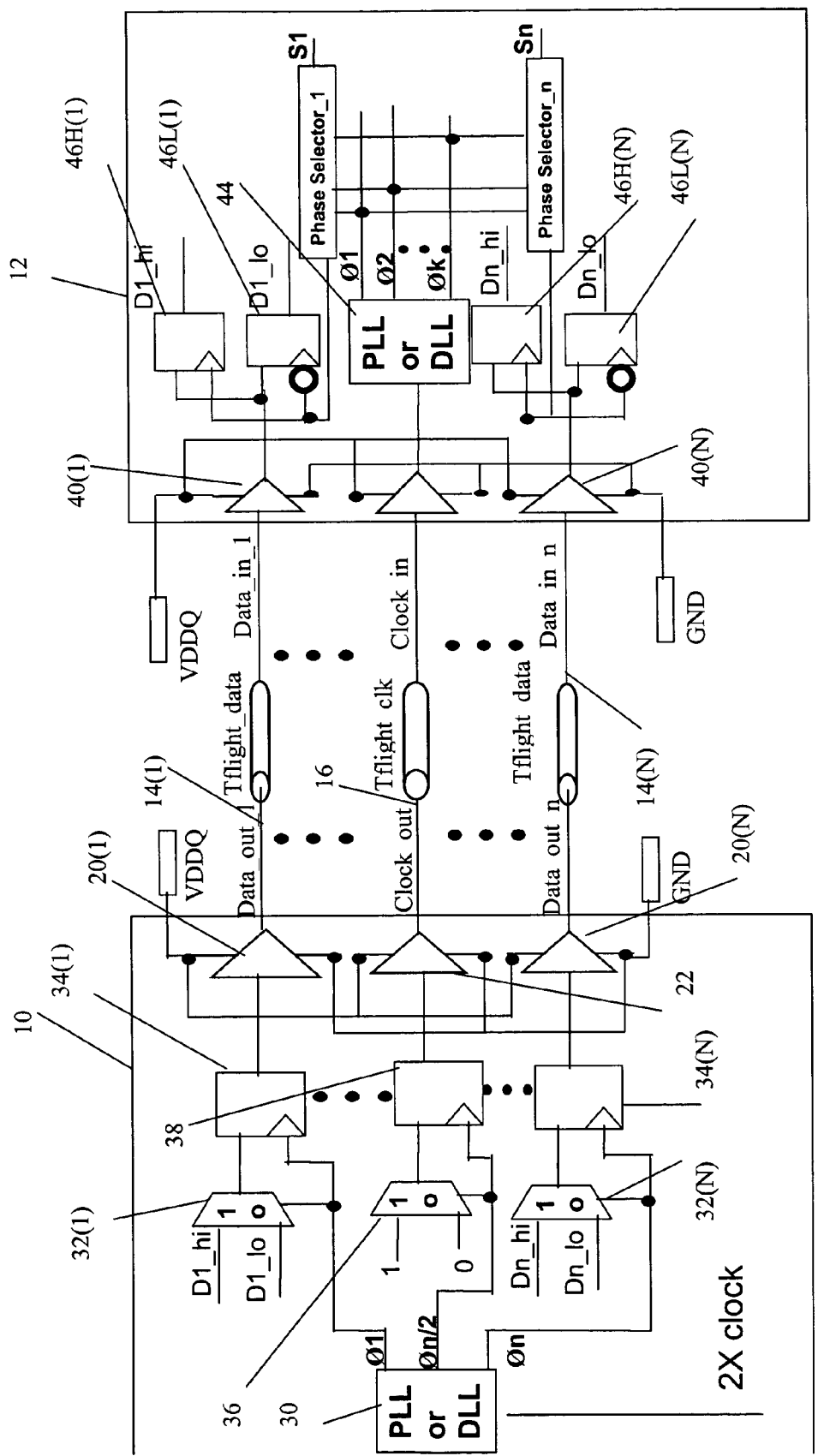
FIG. 3 is a schematic diagram depicting an embodiment of the invention.

Reference will now be made in detail to various embodiments of the invention. Examples of these embodiments are illustrated in the accompanying drawings. While the invention will be described in conjunction with these embodiments, it will be understood that it is not intended to limit the invention to any embodiment. On the contrary, it is intended to cover alternatives, modifications, and equivalents as may be included within the spirit and scope of the invention as defined by the appended claims. In the following description, numerous specific details are set forth in order to provide a thorough understanding of the various embodiments. However, the present invention may be practiced without some or all of these specific details. In other instances, well known process operations have not been described in detail in order not to unnecessarily obscure the present invention. FIG. 3 depicts an embodiment of the invention.

FIG. 3 depicts a Transmitter (Tx) 10 and Receiver (Rx) 12 coupled N single-ended data lines 14(1)-14(N) and a clock line 16. On the Tx side 10, each data line 14 is coupled to a corresponding output driver 20(1)-20(N) and the clock line 16 is coupled to an output clock driver 22. A 2× clock signal is provided so that data is clocked on rising or falling edge of the 2× clock to transfer data at double the data rate (DDR) which is reference to 1× clock at the output of clock driver 22.

In this embodiment, the 2× clock signal is provided to a phase-shifting block 30 which generates N phase-shifted clock Tx clock signals $\phi(1)$-$\phi(n)$ each having the same frequency as the 2× clock signal but displaced from that signal by a different multiple of a fixed, unique phase.

The two-bits of data provided to each output driver 20($n$) per clock cycle are provided to a input series circuit comprising a multiplexer 32($n$) having an output coupled to a latch 34($n$) having an output coupled to the corresponding output driver 20($n$). Each series circuit is coupled to a different one of the phase-shifted clock signals $\phi(n)$ and outputs a single-ended phase-shifted data signal onto the coupled single-ended data line.

A similar series circuit is coupled to the clock driver 22. A clock multiplexer 36 is has inputs coupled to fixed 0 and 1 values and an output coupled to clock latch 38 which has an output coupled to the clock driver 22. The clock multiplexer 36 and clock latch 38 are coupled to the phase-shifted clock signal $\phi(N/2)$ and a Tx source clock signal having a phase shifted by a unique multiple of the fixed phase shift is output on the clock line 16.

Turning to the Rx side 12, each data line 14 is coupled to a corresponding input driver 40(1)-40(N) and the clock line 16 is coupled to an input clock driver 42.

The clock in signal is passed from the input clock driver to an Rx data alignment circuit 44 which receives the transmitted Tx source clock signal and generates a set of 1× compensated Rx clock signals $\phi(1)$-$\phi(N)$ which compensate for the phase shifts introduced into the phase-shifted data signals at the Tx side. The output of each input driver 40(1-N) is coupled to a corresponding pairs of HI and LO input latches 46H(1-N) and 46L(1-N). Each pair of output a latches 46H(n) and 46L(n) receives a compensated Rx clock signal from the DAC 44 adjusted to sample the data on the phase-shifted data signal. The data outputs of the HI and LO latches for each data line provide the data clocked on the rising and falling edge of the provided clock signal.

At the receiver side, each input latch can be clocked by a different compensated Rx clock signal derived from the received Tx source clock signal $\phi(N/2)$. This is accomplished by the Rx DAC 44 which receives $\phi(N/2)$ and generates compensated Rx clock signals $\phi(1)$ to $\phi(N)$. The compensated Rx clock signal provided to a particular pair of receive latches 46 is phase-shifted from the Tx clock signal by a phase-shift required to sample the received data signals.

Alternatively, a single Rx clock signal can be used to drive multiple input latches to sample different phase-shifted data signals due to trace length variations and the impact of the PLL/DLL on the transmit side.

Figure 2:
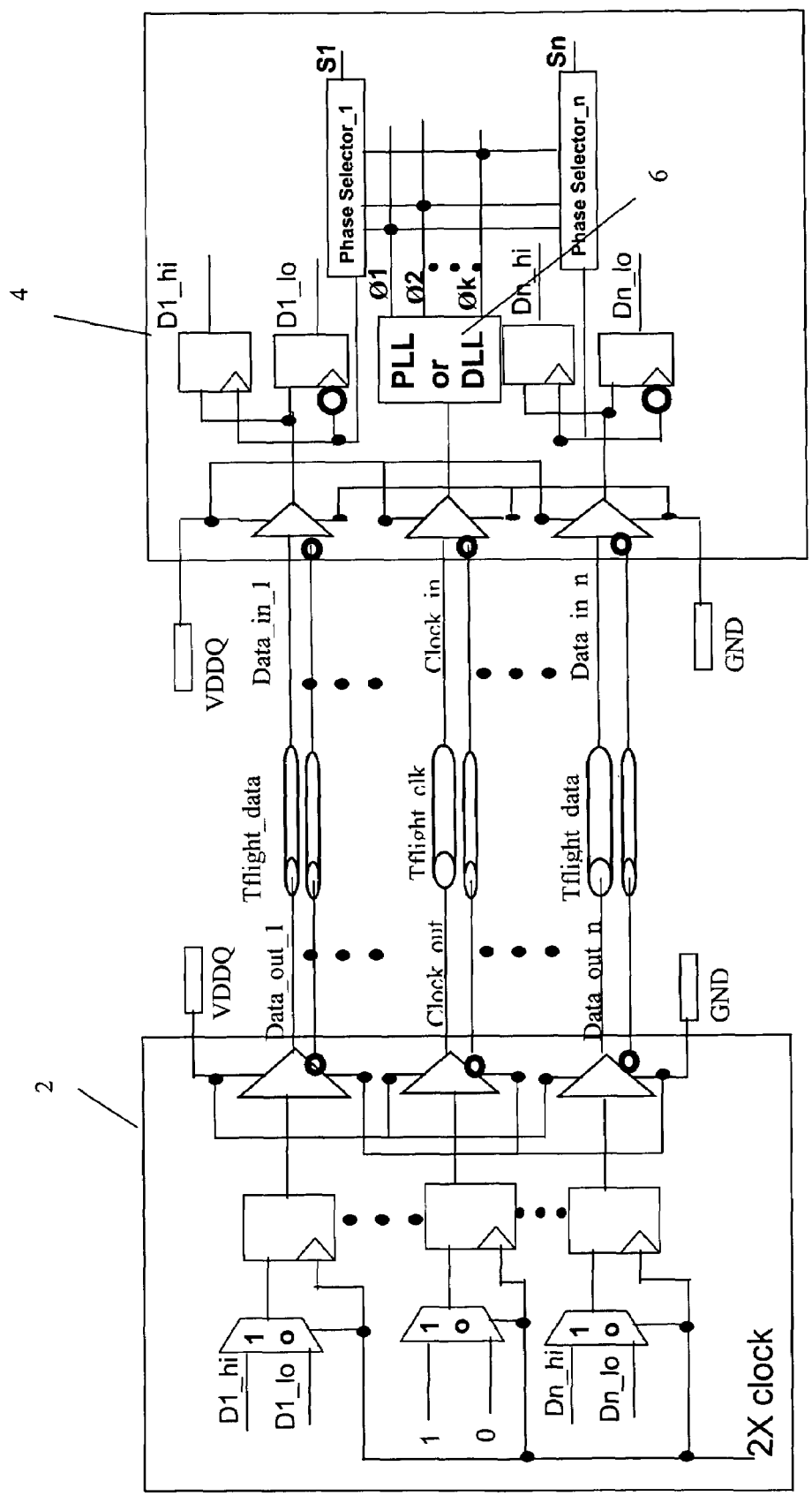
FIG. 2 is a schematic diagram of a typical SPI 4.2 interface utilizing differential signals.
Figures 4A, 4B:
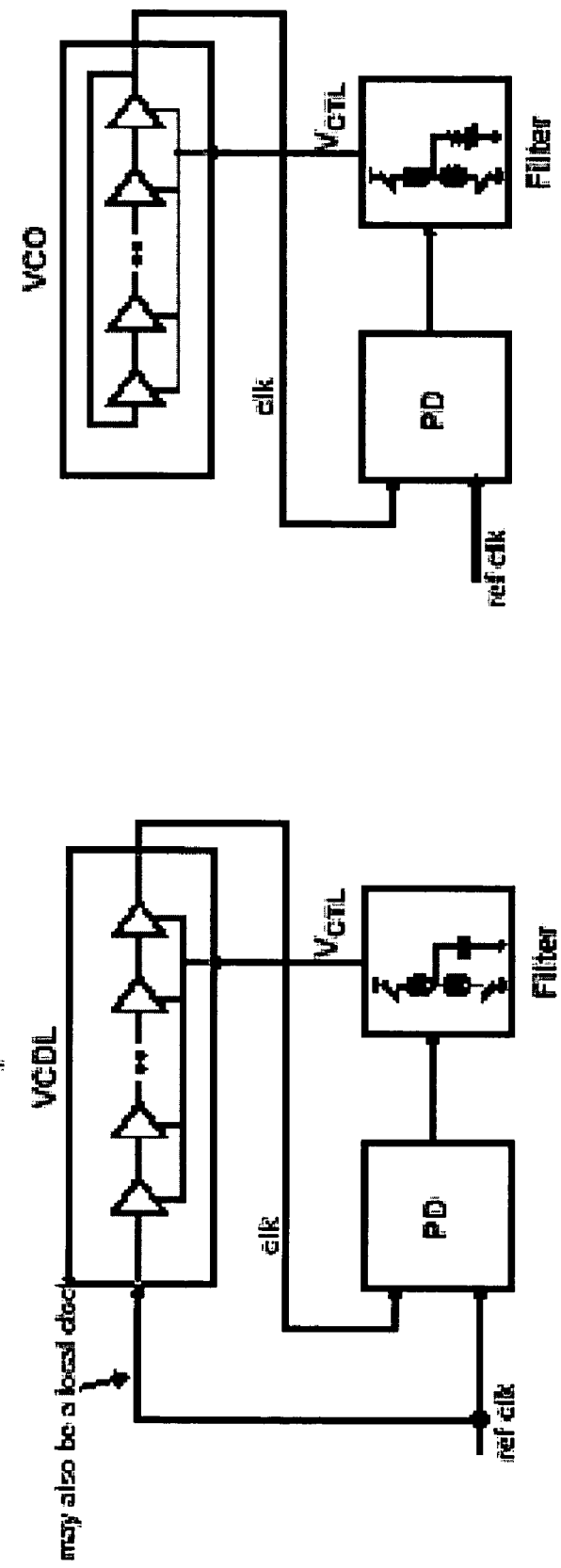
FIGS. 4A and B are schematic diagrams of a DDL or PLL suitable for use in an embodiment of the invention.

The receiver side of the DLL interface of the described embodiment is similar to the receiver side of the SPI 4.2 interface depicted in FIG. 2. In this embodiment training patterns are utilized to select the best clock phases for each input latch prior to normal transmission. In FIG. 3 the phase-shifting block 44 at the Tx side is utilized to provide multiple phase-shifted clock signals. As is known in the art either a PLL (Phase-Locked Loop) or a DLL (Delay Locked Loop) can be utilized to generate these signals. FIGS. 4A and 4B are schematic diagrams of a PLL and a DLL, respectively, that can be utilized in the above-described embodiment.

Figure 1:
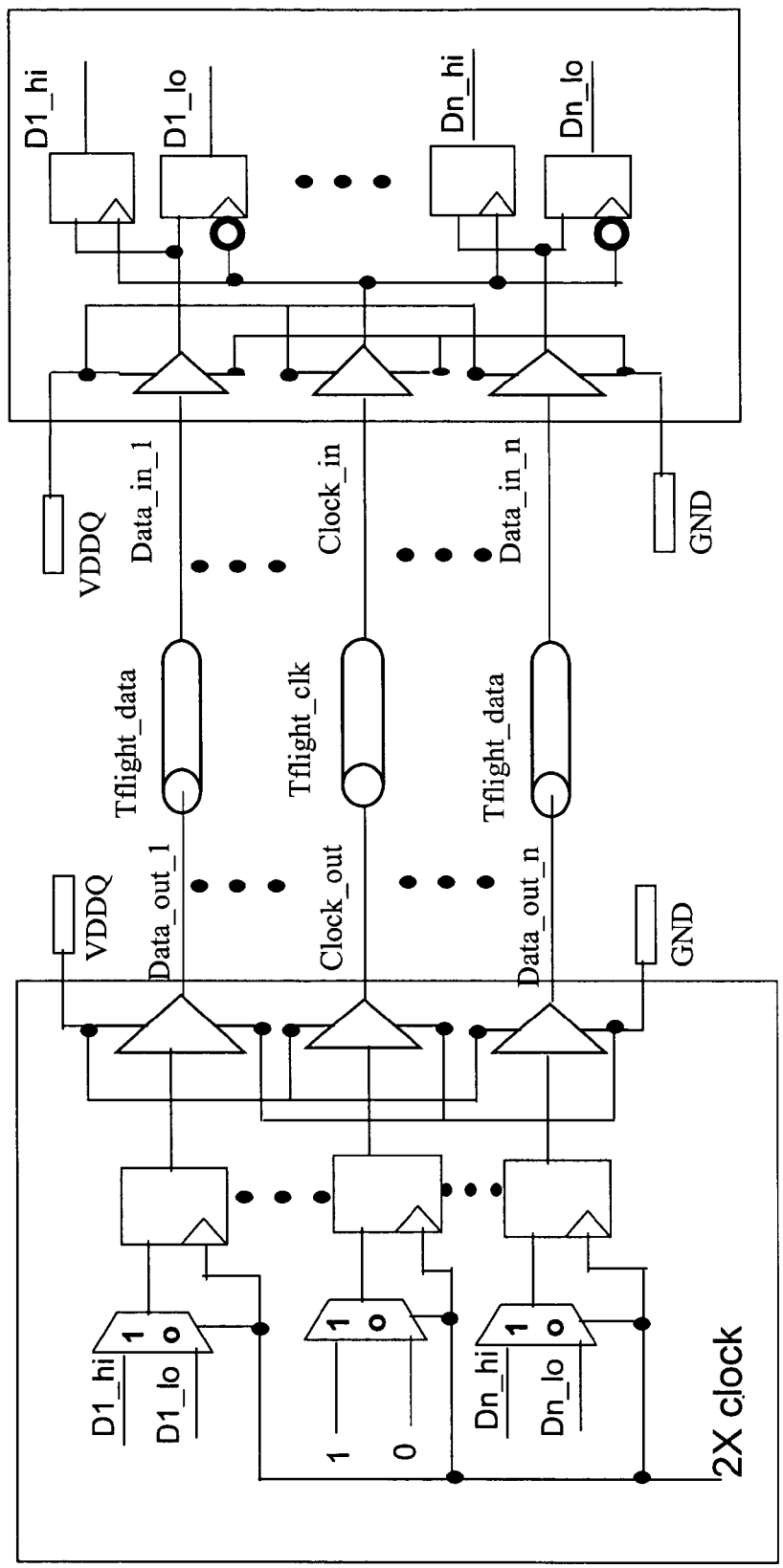
FIG. 1 is a schematic diagram depicting an existing single-ended DDR interface.

The advantages of the system described with reference to FIG. 3 will now be described with reference to FIGS. 5A-B and 6. As depicted in FIG. 3, data on each output line is clocked by different phase-shifted 2× clock output signal, $\phi(1)$-$\phi(N)$. Thus, unlike the circuits depicted in FIGS. 1 and 2 none of the output lines switch at the same time.

FIGS. 5A and 5B depict graphs that illustrate the advantage of not switching all the input lines at the same time. FIG. 5A depicts the spike in IDDQ when a single buffer switches. The spike has a width to T_tr which is equal to about 100 to 300 ps and a height equal to XA milliamps. FIG. 5B depicts the IDDQ spike when all N buffers switch. The IDDQ spike now has an amplitude of N(XA) milliamps. The contribution to SSN due to all the buffers switching simultaneously is on the order N times that due to a single buffer switching.

FIG. 6 depicts the effect of phase-shifting the timing of the switching of various output buffers on the Tx side. In this example, the phase-shift Δt is slightly larger than T_tr. When the first signal, $\phi 1$ is asserted an IDDQ spike of amplitude YA milliamps occurs. However, this spike has damped out during the phase shift interval Δt so that when the second signal, $\phi 2$, delayed relative to $\phi 1$ by ΔT, is asserted a second spike occurs but the effect is not cumulative since the first spike has damped out. Thus, the phase shifting of the clock signals provided to the output buffers has reduced the amplitude of the IDDQ spike by a factor of N. The magnitude of the cumulative IDDQ spike will be reduced as long as the phase-shift is sufficiently large to shift the peaks of the individual IDDQ spikes to prevent their summation.

Accordingly, an embodiment of an improved DDR interface has been described having the following advantages: 1) The peak current from the I/O switching will be significantly reduced; 2) The SSO/SSI noise on VDDQ will be significantly reduced; 3) The jitter and uncertainty caused by SSO/SSI will be significantly reduced; 4) The DDR interface bandwidth can be increased; 5) The required VDDQ power/ground pins can be reduced, so the package size can be reduced; and, 6) Since the VDDQ is the biggest noise source on the PCB board and package, the new enhanced DDR interface will has much smaller noise coupling to other circuits from VDDQ.

The invention has now been described with reference to the preferred embodiments. Alternatives and substitutions will now be apparent to persons of skill in the art. For example, different logic circuits could be utilized to switch the data signals onto and off the data lines. Also, in the above described embodiment, each phase-shifted Tx clock signal is utilized to switch data onto a single data line. However, as is known in the art, each phase-shifted Tx clock signal can be utilized to switch data onto a set of data lines. In this case, the magnitude of the IDDQ spike would be reduced in proportion to the number of phase-shifted Tx clock signals utilized to switch the signals. Accordingly, it is not intended to limit the invention except as provided by the appended claims.

What is claimed is:

1. A system comprising:
   a transmit side having a double-data rate (DDR) interface adapted to transfer data on both the rising and falling edges of a source clock signal, with data signals transferred on N single-ended data lines and a source clock signal transferred on a single-ended clock line, with the transmit side including:
   a Tx phase-shifting block having N clock signal outputs, with the Tx phase-shifting block adapted to receive a 2× clock signal having double the frequency of the source clock signal, adapted to generate a plurality of phase-shifted Tx clock signals, with each phase-shifted Tx clock signal output by a corresponding clock signal output, and with successive phase-shifted Tx clock signals shifted in time by a different multiple of Δt relative to the received 2× clock signal;
   a plurality of N output signal switching blocks, each coupled to a corresponding one of the N single-ended data lines and directly coupled to a clock signal output of the Tx phase-shifting block, adapted to receive a phase-shifted Tx clock signal output by the directly coupled clock signal output as a phase-shifted data-out Tx clock signal, where each output signal switching block is adapted to switch a single-ended phase-shifted DDR data signal onto the corresponding data line in synchronism with a coupled phase-shifted data-out Tx clock signal with switching of successive single-ended phase-shifted DDR data signals shifted in time by a different multiple of Δt relative to the 2× clock signal; and
   a clock signal switching block, coupled to the Tx phase-shifting block and adapted to receive a single-ended phase-shifted Tx clock signal as a phase-shifted Tx clock signal, adapted to switch a single-ended Tx source clock signal onto the source clock line in synchronism with a received phase-shifted Tx clock signal;
   a receive side, having a DDR interface, comprising:
   a plurality of N input sampling blocks, each coupled to a corresponding one of the N single-ended signal lines, each sampling block adapted to sample a single-ended phase-shifted data signal from the corresponding data line in synchronism with a coupled compensated Rx clock signal; and
   an Rx dynamic adjustment circuit, coupled to the N input sampling blocks, adapted to receive the single-ended phase-shifted Tx source clock signal and to generate a plurality of compensated Rx clock signals adjusted in phase to compensate for phase shifts introduced into corresponding single-ended phase-shifted DDR data signals at the transmit side, and adapted to couple a compensated Rx clock signal to each input latch to sample a corresponding single-ended phase-shifted DDR data signal.

2. The system of claim 1 where each output signal switching block comprises:
   a multiplexor having data inputs coupled to receive first and second data signals, a control input coupled to receive a phase-shifted Tx data-out clock signal, and a data output; and
   a latch having a data input coupled to the data output of the multiplexor and a clock input coupled to receive the phase-shifted data-out Tx clock signal.

3. The system of claim 1 where said Tx phase-shifting block comprises a phase-locked loop.

4. The system of claim 1 where said Tx phase-shifting block comprises a delay-locked loop.

5. A method comprising:
   at a transmit side of the DDR interface that utilizes single-ended data lines and a single-ended source clock line:
   phase-shifting a set of single-ended data signals to be transmitted relative to each other prior to transmission to form a set of phase-shifted single-ended data signals, with successive single-ended data signals shifted in time by a non-variable multiple of a fixed time interval;
   phase-shifting a single-ended source clock signal relative to each single-ended data signal included in the set of single-ended data signals to form a phase-shifted source clock signal; and
   transmitting the set of phase-shifted single-ended data signals and a phase-shifted source clock signal, with switching of successive phase-shifted single-ended data signals shifted in time by a different multiple of the fixed time interval relative to the single-ended source clock signal;
   at a receive side of the DDR interface:
   generating a set of phase-shifted receive clock signals based on a received phase-shifted source clock signal transmitted by the transmit side of the DDR interface with a phase-shift in each of the phase-shifted receive clock signals adjusted to compensate for the phase-shift in a corresponding phase-shifted single-ended data signal transmitted by the transmit side of the DDR interface; and
   sampling each of the phase-shifted single-ended data signals transmitted by the transmit side of the DDR interface utilizing a corresponding phase-shifted receive clock signal to compensate for the phase shift introduced at the transmit side of the DDR interface.

6. A system comprising:
   at a transmit side of a DDR interface that utilizes single-ended data lines and a single-ended source clock line:
   means for phase-shifting a set of single-ended data signals to be transmitted relative to each other prior to transmission to form a set of phase-shifted single-ended data signals;
   means for phase-shifting a single-ended source clock signal relative to each single-ended data signal included in the set of single-ended data signals to form a phase-shifted source clock signal, with successive single-ended data signals shifted in time by a non-variable multiple of a fixed time interval; and
   means for transmitting the set of phase-shifted single-ended data signals and a phase-shifted source clock signal, with switching of successive phase-shifted single-ended data signals shifted in time by a different multiple of the fixed time interval relative to the single-ended source clock signal;
   at a receive side of the DDR interface:
   means for generating a set of phase-shifted receive clock signals based on a received phase-shifted source clock signal transmitted by the transmit side of the DDR interface with a phase-shift in each of the phase-shifted receive clock signals adjusted to compensate for the phase-shift in a corresponding phase-shifted single-ended data signal transmitted by the transmit side of the DDR interface; and
   means for sampling each of the phase-shifted single-ended data signals transmitted by the transmit side of the DDR interface utilizing a corresponding phase-shifted receive clock signal to compensate for the phase shift introduced at the transmit side of the DDR interface.

7. The system of claim 6 where said means for phase-shifting comprises a phase-locked loop.

8. The system of claim 6 where said means for phase-shifting comprises a delay-locked loop.

9. A system comprising:

a transmit side having a double-data rate (DDR) interface adapted to transfer data on both the rising and falling edges of a source clock signal, with data signals transferred on N single-ended data lines and a source clock signal transferred on a single-ended clock line, with the transmit side including:

a Tx phase-shifting block having N clock signal outputs, with the Tx phase-shifting block adapted to receive a reference clock signal, and adapted to generate a plurality of phase-shifted Tx clock signals, with each phase-shifted Tx clock signal output by a corresponding clock signal output, and with successive phase-shifted Tx clock signals shifted in time by a different multiple of $\Delta t$ relative to the received reference clock signal;

a plurality of N output signal switching blocks, each coupled to at least one corresponding single-ended data line in the set of single-ended data lines and directly coupled to a clock signal output of the Tx phase-shifting block adapted to receive a phase-shifted Tx clock signal output by the directly coupled clock signal output as a phase-shifted data-out Tx clock signal, where each output signal switching block is adapted to switch a single-ended phase-shifted DDR data signal onto at least one corresponding data line in synchronism with a coupled phase-shifted data-out Tx clock signal with switching of successive single-ended phase-shifted DDR data signals shifted in time by a different multiple of $\Delta t$ relative to the 2× clock signal;

a clock signal switching block, coupled to the Tx phase-shifting block adapted to receive a single-ended phase-shifted Tx clock signal as a phase-shifted Tx clock signal, and adapted to switch a single-ended Tx source clock signal onto the source clock line in synchronism with a received phase-shifted Tx clock signal.

* * * * *